(12) United States Patent
Hsu et al.

(10) Patent No.: US 10,872,915 B2
(45) Date of Patent: Dec. 22, 2020

(54) OPTICAL PACKAGE STRUCTURE AND METHOD FOR MANUFACTURING THE SAME

(71) Applicant: ADVANCED SEMICONDUCTOR ENGINEERING, INC., Kaoshiung (TW)

(72) Inventors: Chia Yun Hsu, Kaohsiung (TW); Ying-Chung Chen, Kaohsiung (TW)

(73) Assignee: ADVANCED SEMICONDUCTOR ENGINEERING, INC., Kaoshiung (TW)

( * ) Notice: Subject to any disclaimer, the term of this patent is extended or adjusted under 35 U.S.C. 154(b) by 0 days.

(21) Appl. No.: 16/254,389

(22) Filed: Jan. 22, 2019

(65) Prior Publication Data
US 2020/0235153 A1 Jul. 23, 2020

(51) Int. Cl.
*H01L 31/0203* (2014.01)
*H01L 27/146* (2006.01)
*H01L 31/0232* (2014.01)
*H01L 31/18* (2006.01)

(52) U.S. Cl.
CPC .. *H01L 27/14618* (2013.01); *H01L 27/14625* (2013.01); *H01L 27/14683* (2013.01); *H01L 31/0203* (2013.01); *H01L 31/0232* (2013.01); *H01L 31/1876* (2013.01)

(58) Field of Classification Search
CPC ........... H01L 27/14618; H01L 27/1462; H01L 27/14625; H01L 27/14683; H01L 27/14685; H01L 31/0203; H01L 31/0232; H01L 31/02327; H01L 31/1876
See application file for complete search history.

(56) References Cited

U.S. PATENT DOCUMENTS

| | | | |
|---|---|---|---|
| 6,566,745 B1* | 5/2003 | Beyne | H01L 27/14618 257/431 |
| 6,995,462 B2 | 2/2006 | Bolken et al. | |
| 7,227,236 B1* | 6/2007 | Lee | G02B 7/02 257/294 |
| 2009/0038843 A1* | 2/2009 | Yoneda | H01S 5/02296 174/521 |
| 2011/0031509 A1* | 2/2011 | Kirihara | H01L 24/97 257/81 |
| 2012/0211852 A1* | 8/2012 | Iwafuchi | H01L 27/1462 257/435 |

(Continued)

FOREIGN PATENT DOCUMENTS

WO WO-2014064541 A2 * 5/2014 ............. H01L 33/64

*Primary Examiner* — Stephen W Smoot
(74) *Attorney, Agent, or Firm* — Foley & Lardner LLP

(57) ABSTRACT

An optical package structure includes a substrate, an optical element, a spacer and an encapsulant. The substrate has a top surface. The optical element is disposed adjacent to the top surface of the substrate and has a first height $H_1$. The spacer surrounds the optical element and has a top surface. A distance between the top surface of the substrate and the top surface of the spacer is defined as a second height $H_2$. The encapsulant is disposed between the optical element and the spacer, and has a third height $H_3$ at a position adjacent to the optical element. The encapsulant covers at least a portion of the optical element. The optical element is exposed from the encapsulant, and $H_2 > H_1 \geq H_3$.

19 Claims, 17 Drawing Sheets

(56) References Cited

U.S. PATENT DOCUMENTS

2013/0149805 A1* 6/2013 Chuang ............... H01L 31/18
                                                    438/65
2019/0393254 A1* 12/2019 Chen ................ H01L 27/14618

* cited by examiner

US 10,872,915 B2

OPTICAL PACKAGE STRUCTURE AND METHOD FOR MANUFACTURING THE SAME

BACKGROUND

1. Field of the Disclosure

The present disclosure relates to an optical package structure and a method, and to an optical structure having a spacer, and a method for manufacturing the optical structure.

2. Description of the Related Art

In an optical package structure including an optical element, an encapsulant may be disposed to covers the optical element, while an active area of a surface of the optical element is exposed from the encapsulant. Hence, in a manufacturing process of such optical package structure, the active area of the optical element may be initially covered by a removable mold disposed thereon, and then the encapsulant is formed to surround a lateral surface and a top surface of the optical element, and the mold. Finally, the removable mold is removed, thus forming an opening of the encapsulant to expose the active area of the optical element. In a subsequent process, a panel may be disposed on a top surface of the optical package structure, such as the top surface of the encapsulant. However, since a portion of the encapsulant is disposed on the top surface of the optical element, the optical package structure is rather thick and should be improved.

SUMMARY

In some embodiments, an optical package structure includes a substrate, an optical element, a spacer and an encapsulant. The substrate has a top surface. The optical element is disposed adjacent to the top surface of the substrate and has a first height $H_1$. The spacer surrounds the optical element and has a top surface. A distance between the top surface of the substrate and the top surface of the spacer is defined as a second height $H_2$. The encapsulant is disposed between the optical element and the spacer, and has a third height $H_3$ at a position adjacent to the optical element. The encapsulant covers at least a portion of the optical element. The optical element is exposed from the encapsulant, and $H_2 > H_1 \geq H_3$.

In some embodiments, an optical package structure includes a substrate, an optical element, a spacer and an encapsulant. The substrate has a top surface. The optical element is disposed adjacent to the top surface of the substrate. The spacer surrounds the optical element and has an outer surface. The encapsulant covers at least a portion of the optical element and is disposed between the optical element and the spacer. The encapsulant is exposed from the outer surface of the spacer, and a lateral surface of the encapsulant is substantially coplanar with the outer surface of the spacer.

In some embodiments, a method for manufacturing an optical package structure includes: (a) providing a plurality of optical elements adjacent to a top surface of a substrate, wherein the optical elements have a first height $H_1$; and (b) providing at least one spacer on the substrate and dispensing at least one encapsulant surrounding the optical elements, wherein the spacer has a top surface, a distance between the top surface of the substrate and the top surface of the spacer is defined as a second height $H_2$, the encapsulant has a third height $H_3$ at a position adjacent to the optical elements, and $H_2 > H_1 \geq H_3$.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
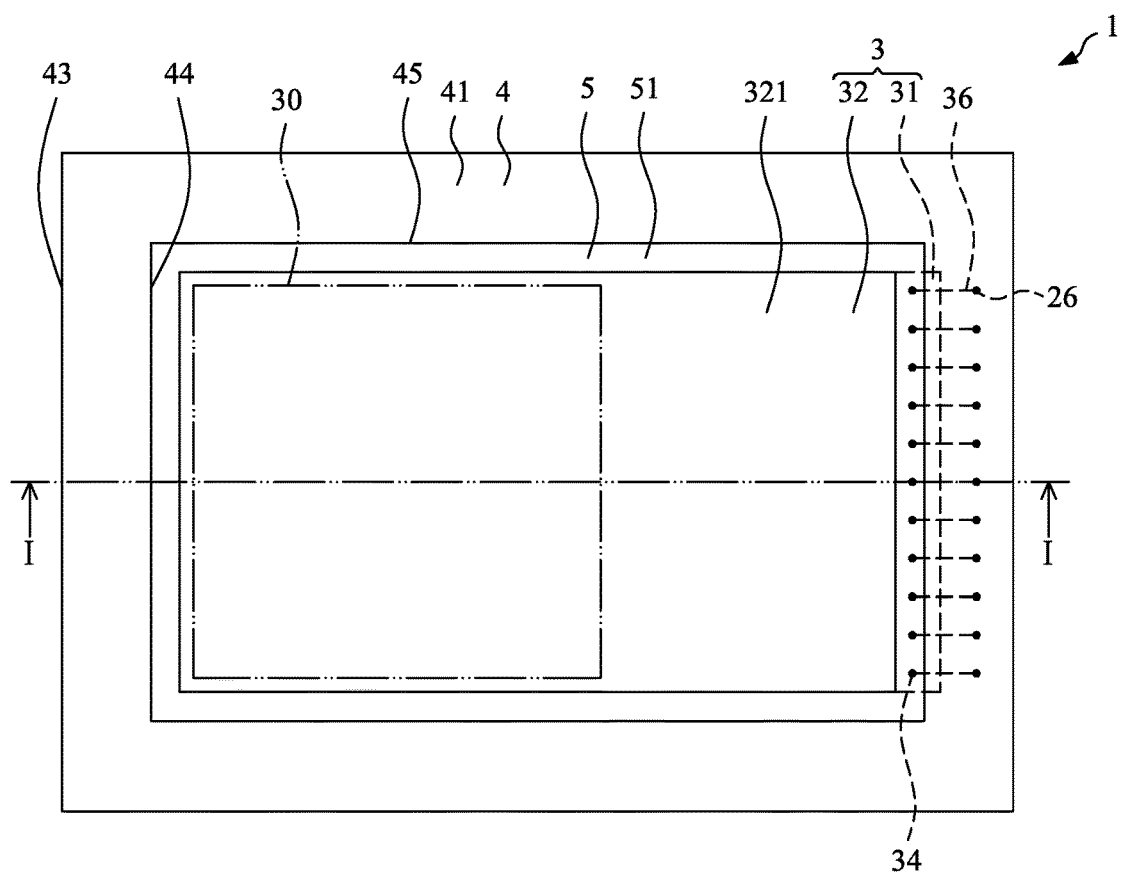
FIG. 1 illustrates a top view of an example of an optical package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To reduce the thickness of the aforementioned optical package structure, another example approach provides an encapsulant surrounding the lateral surface of the optical element, while not disposed on the top surface of the optical element. For example, the encapsulant may be dispensed around the lateral surface of the optical element. In a subsequent process, since the top surface of the encapsulant formed by dispensing is not flat, a panel cannot be disposed on and supported by the encapsulant. Accordingly, a supporting structure should be provided to surround the optical package structure for supporting the panel, which adversely increases the production cost and the size of the thereof.

The present disclosure addresses at least the above concerns and provides for an improved optical package structure, and improved techniques for manufacturing the optical package structure. In the optical package structure, a spacer is disposed on the encapsulant, thus a panel can be disposed on and supported by the spacer.

Figure 2:
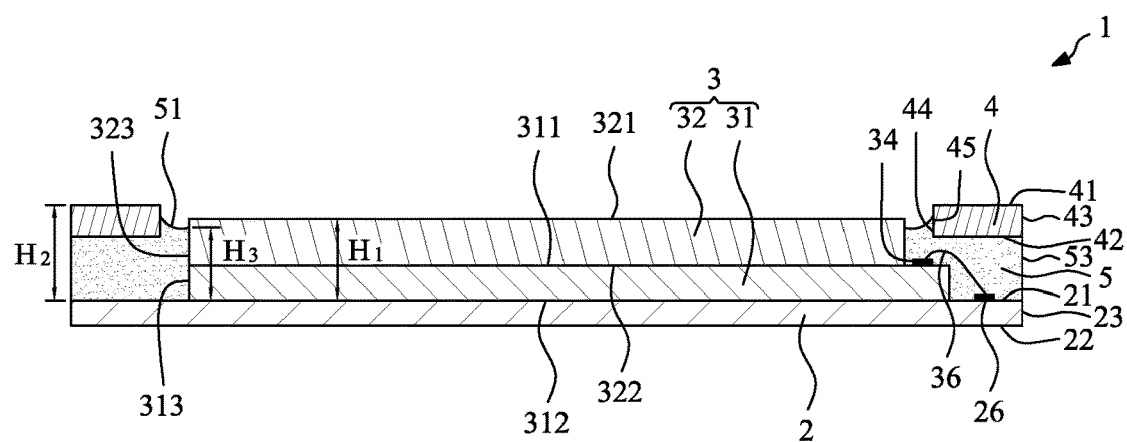
FIG. 2 illustrates a cross-sectional view taken along line I-I of the optical package structure shown in FIG. 1.

FIG. 1 illustrates a top view of an optical package structure 1 according to some embodiments of the present disclosure. FIG. 2 illustrates a cross-sectional view taken along line I-I of the optical package structure 1 shown in FIG. 1. The optical package structure 1 includes a substrate 2, an optical element 3, at least one wire 36, a spacer 4 and an encapsulant 5.

The substrate 2 has a first surface 21, a second surface 22 opposite to the first surface 22, and a lateral surface 23 extending between the first surface 21 and the second surface 22. The first surface 21 may be a top surface. The substrate 2 may be a substrate of any type and material, which is not limited in the present disclosure. For example, the substrate 2 may include styrene-butadiene-styrene (SBS). In some embodiments, the substrate 2 may include a circuit layer having at least one conductive pad 26 disposed on the first surface 21.

The optical element 3 is disposed on the substrate 2, such as on the first surface 21 of the substrate 2. The optical element 3 may include an active area (sensing area) 30. In some embodiments, the optical element 3 includes an optical sensing chip 31 and a light-transmissive component 32 sequentially disposed on the substrate 2. The optical sensing chip 31 may be a contact image sensor (CIS) chip or a fingerprint recognition chip, and the light-transmissive component 32 may be a collimating element. The optical sensing chip 31 has a first surface 311, a second surface 312 opposite to the first surface 311, and a lateral surface 313 extending between the first surface 311 and the second surface 312. The second surface 312 of the optical sensing chip 31 may be attached to the first surface 21 of the substrate 2 by, for example, adhesion. The light-transmissive component 32 covers a portion of the optical sensing chip 31, while another portion of the second surface 312 of the optical sensing chip 31 is exposed. The optical sensing chip 31 may also include a circuit layer having a conductive pad 34 disposed on the first surface 311.

The light-transmissive component 32 has a first surface 321, a second surface 322 opposite to the first surface 321, and a lateral surface 323 extending between the first surface 321 and the second surface 322. The second surface 322 of the light-transmissive component 32 may be attached to the first surface 311 of the optical sensing chip 31 by, for example, adhesion. The lateral surface 313 of the optical sensing chip 31 and the lateral surface 323 of the light-transmissive component 32 may be coplanar at least at one side, as shown in FIG. 2. However, in other embodiments, the lateral surface 313 of the optical sensing chip 31 and the lateral surface 323 of the light-transmissive component 32 may not be coplanar. The active area (sensing area) 30 may be located at the optical sensing chip 31. The active area (sensing area) 30 is for receiving light from surroundings or receiving external pressing force. A size of the light-transmissive component 32 is less than a size of the optical sensing chip 31. Thus, the light-transmissive component 32 may not cover or contact the conductive pad 34 of the optical sensing chip 31. As shown in FIG. 2, the optical element 3 is a combination of two elements (e.g., the optical sensing chip 31 and the light-transmissive component 32). However, in other embodiments, the optical element 3 may be a single element, or the optical element 3 may include three or more elements.

The wire 36 connects the conductive pad 34 of the optical sensing chip 31 and the conductive pad 26 of the substrate 2. That is, the optical element 3 is electrically connected to the substrate 2 through the wire 36. Thus, the signals generated by the optical element 3 may be transmitted to the substrate 2 through the wire 36. A material of the wire 36 may include copper, gold or other suitable metal. As shown in FIG. 2, the wire 36 is disposed on one side of the optical sensing chip 31. However, in other embodiments, the wire 36 may be disposed on two or more sides of the optical sensing chip 31.

The spacer 4 is disposed on the encapsulant 5 and surrounds the optical element 3. The spacer 4 has a first surface 41, a second surface 42 opposite to the first surface 41, and an outer surface 43 extending between the first surface 41 and the second surface 42. The first surface 21 may be a top surface. In some embodiments, the first surface 41 may be substantially flat. The second surface 42 faces the first surface 21 of the substrate 2 and contacts the encapsulant 5. The spacer 4 is in a closed ring shape from a top view. As shown in FIG. 1, the spacer 4 is in a shape of a rectangular frame. That is, the spacer 4 has an inner surface 44 defining a through hole 45 extends from the first surface 41 to the second surface 42 thereof. A portion of the optical element 3, such as the light-transmissive component 32, is exposed in the through hole 45 of the spacer 4. The spacer 4 may cover a portion of the substrate 2, a portion of the optical sensing chip 31 and a portion of the wire 36. For example, the wire 36 and the substrate 2 may be disposed under the spacer 4. In some embodiments, the spacer 4 does not contact the substrate 2. For example, the spacer 4 may be disposed on the encapsulant 5. There is a gap between the second surface 42 of the spacer 4 and the first surface 21 of the substrate 2.

The encapsulant 5 is disposed between the optical element 3 and the spacer 4, and between the spacer 4 and the substrate 2. Further, the encapsulant 5 covers at least a portion of the optical element 3, at least a portion of the substrate 2 and the wire 36. For example, the encapsulant 5 is disposed on the first surface 21 of the substrate 2 and on the portion of the first surface 311 of the optical sensing chip 31. The encapsulant 5 contacts the second surface 42 of the spacer 4, thus, the second surface 42 of the spacer 4 is supported by the encapsulant 5. In some embodiments, a portion of the encapsulant 5 is further disposed between the lateral surface 323 of the light-transmissive component 32 and the inner surface 44 of the spacer 4, and is exposed in the through hole 45 of the spacer 4. The encapsulant 5 has a concave surface 51 (e.g., a top surface) between the lateral surface 323 of the light-transmissive component 32 and the inner surface 44 of the spacer 4. Another portion of the encapsulant 5 is further disposed under the spacer 4. The encapsulant 5 is exposed from the outer surface 43 of the spacer 4. The encapsulant 5 has a lateral surface 53, which is substantially coplanar with the outer surface 43 of the spacer 4 and/or the lateral surface 23 of the substrate 2. A material of the encapsulant 5 may be made of a molding compound or an underfill, which is not limited in the present disclosure. Preferably, the encapsulant 5 provides light shielding function, such as having a light transmittance lower than 0.1% at a thickness of about 200 μm.

As shown in FIG. 2, the optical element 3 has a first height $H_1$. A distance between the top surface (e.g., the first surface 21) of the substrate 2 and the top surface (e.g., the first surface 41) of the spacer 4 is defined as a second height $H_2$. The encapsulant 5 has a third height $H_3$ at a position adjacent to the optical element 3, and $H_2 > H_1 \geq H_3$. For example, the first height $H_1$ may be defined between the second surface 312 of the optical sensing chip 31 and the first surface 321 of the light-transmissive component 32. The third height $H_3$ may be a distance from the first surface 21 of the substrate 2 to a topmost point of the encapsulant 5 contacting the lateral surface 323 of the light-transmissive component 32 (or an intersection point of the concave surface 51 of the encapsulant 5 and the lateral surface 323 of the light-transmissive component 32).

Figure 3:
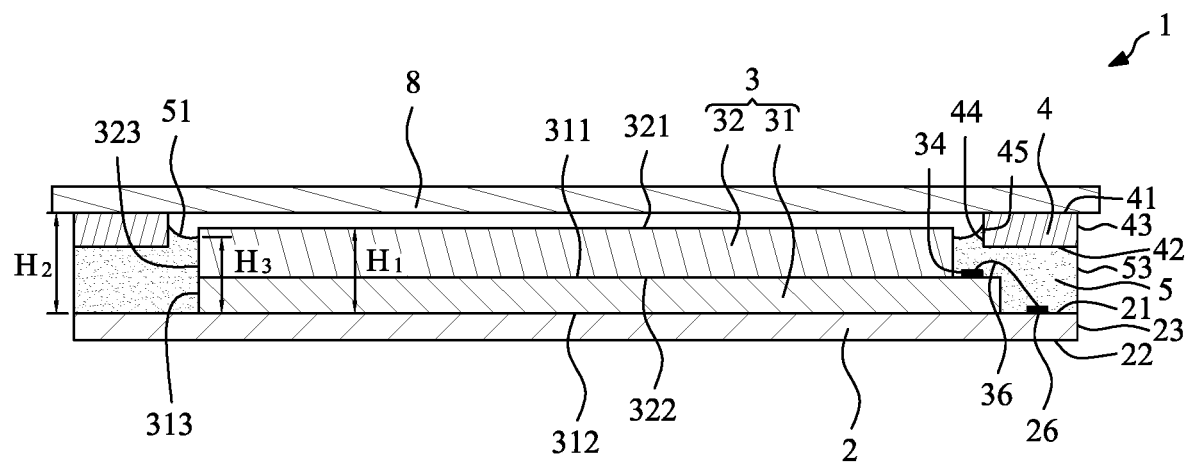
FIG. 3 illustrates a cross-sectional view of an assembly of a panel and the optical package structure shown in FIGS. 1 and 2.

In a device including the optical package structure 1, a panel 8 (as shown in FIG. 3) may be directly disposed on the spacer 4 of the optical package structure 1. The optical package structure 1 may provide a substantially flat surface (e.g., the first surface 41 of the spacer 4) for the panel 8 to be disposed thereon, and no further supporting structure surrounding the optical package structure 1 is included for the panel 8 disposed thereon. Since the second height $H_2$ is greater than the first height $H_1$, the panel 8 may not contact the optical element 3, thus preventing damage of the optical element 3. Besides, since the first height $H_1$ is equal to or greater than the third height $H_3$, the encapsulant 5 may not cover the first surface 321 of the light-transmissive component 32 of the optical element 3. Thus, the encapsulant 5 may not cover the active area (sensing area) 30 of the optical element 3, and may not influence the function of the optical element 3. Accordingly, the optical package structure 1 is provided with a reduced thickness. For example, the thickness of the optical package structure 1 may be about 600 μm to about 700 μm.

Figure 4:
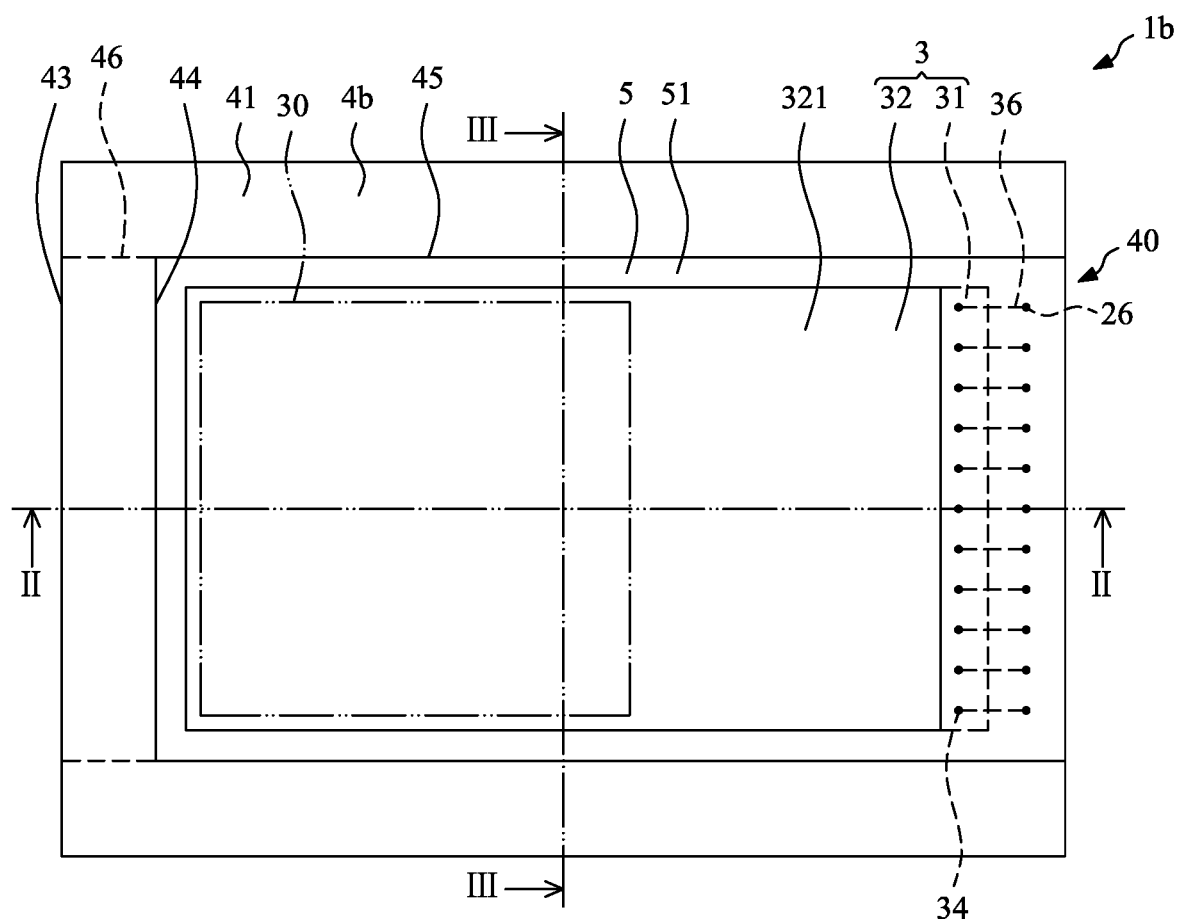
FIG. 4 illustrates a top view of an example of an optical package structure according to some embodiments of the present disclosure.
Figure 5:
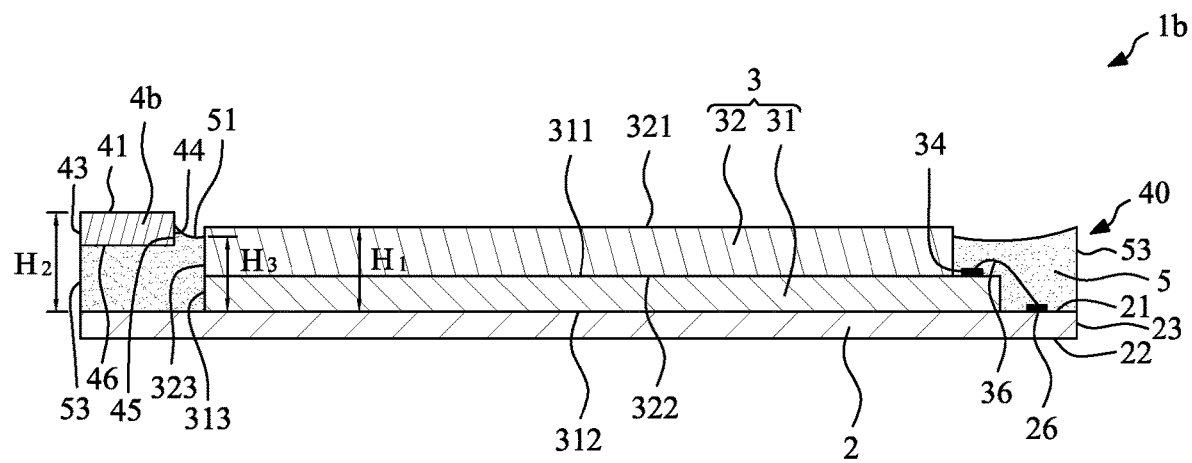
FIG. 5 illustrates a cross-sectional view taken along line II-II of the optical package structure shown in FIG. 4.
Figure 6:
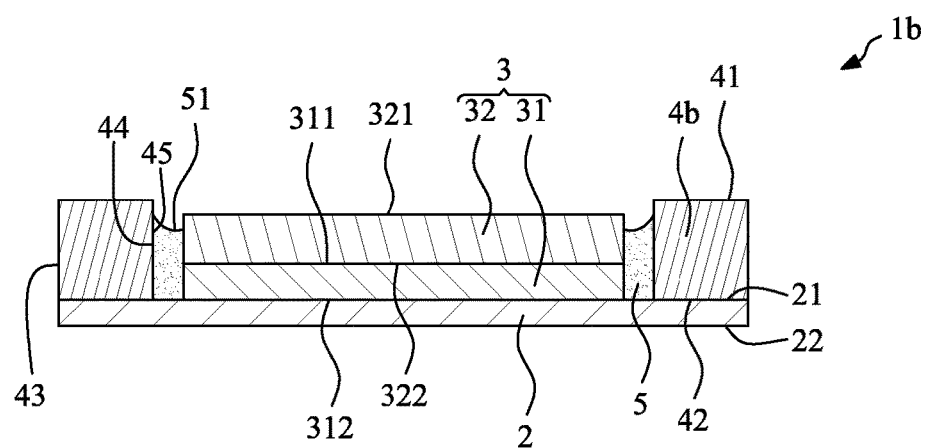
FIG. 6 illustrates a cross-sectional view taken along line of the optical package structure shown in FIG. 4.
Figure 7:
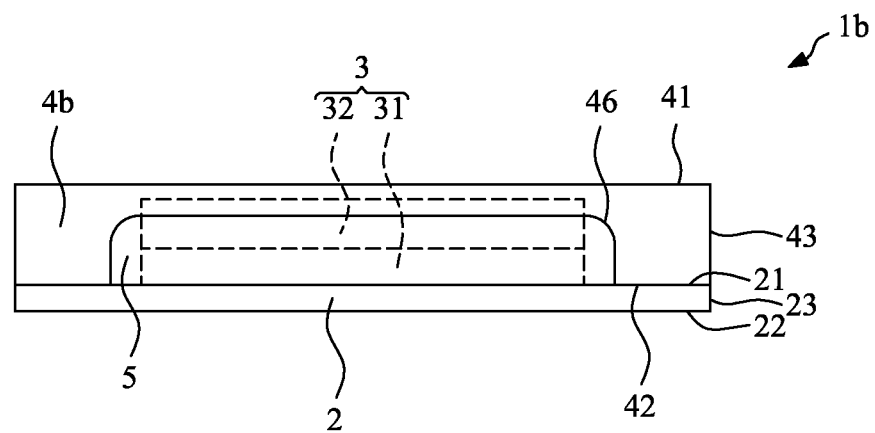
FIG. 7 illustrates a left side view of the optical package structure shown in FIG. 4.

FIG. 4 illustrates a top view of an optical package structure 1b according to some embodiments of the present disclosure. FIGS. 5 and 6 illustrate cross-sectional views taken along line II-II and line of the optical package structure 1b shown in FIG. 4, respectively. FIG. 7 illustrates a left side view of the optical package structure 1b shown in FIG. 4. The optical package structure 1b is similar to the optical package structure 1 shown in FIGS. 1 and 2, except for the structure of the spacer 4b.

As shown in FIG. 6, the spacer 4b is disposed on and attached to the substrate 2. For example, the spacer 4b may be in a shape of a wall extends upwards from the first surface 21 of the substrate 2, and a bottom of the spacer 4b may contact or stand on the first surface 21 of the substrate 2. In some embodiments, the spacer 4b defines an opening 40. That is, the spacer 4b is not in a closed ring shape from a top view. For example, as shown in FIG. 4, the spacer 4b is in a rectangular shape from the top view, while one side of the rectangle is missing. The opening 40 is thus defined at the missing side. The encapsulant 5 is exposed from the missing side and in the opening of the spacer 4b. The wire 36 may be located adjacent to the opening 40 of the spacer 4b, thus may not be covered by the spacer 4b.

As shown in FIGS. 5 and 7, the spacer 4b further defines a tunnel 46. For example, the tunnel 46 may be located at a side opposite to the opening 40. The tunnel 46 extends form the outer surface 43 to the inner surface 44 of the spacer 4b. A portion of the encapsulant 5 is further disposed in and fills the tunnel 46 of the spacer 4b. Accordingly, the encapsulant 5 is exposed from the outer surface 43 of spacer 4b. A shape of the tunnel 46 is not limited in the present disclosure. In one embodiment, a width of the tunnel 46 is greater than a width of the optical element 3

Since the spacer 4b stands on the substrate 2, the spacer 4b provides a stronger support for the panel 8 (FIG. 3) disposed thereon. Besides, the tunnel 46 provides a communicating path for the encapsulant 5 to flow therethrough during a manufacturing process of the optical package structure 1b. In addition, the inner surface 44 of the spacer 4b may further define a recess portion, so as to facilitate the flow of the encapsulant 5 during the manufacturing process.

Figure 8:
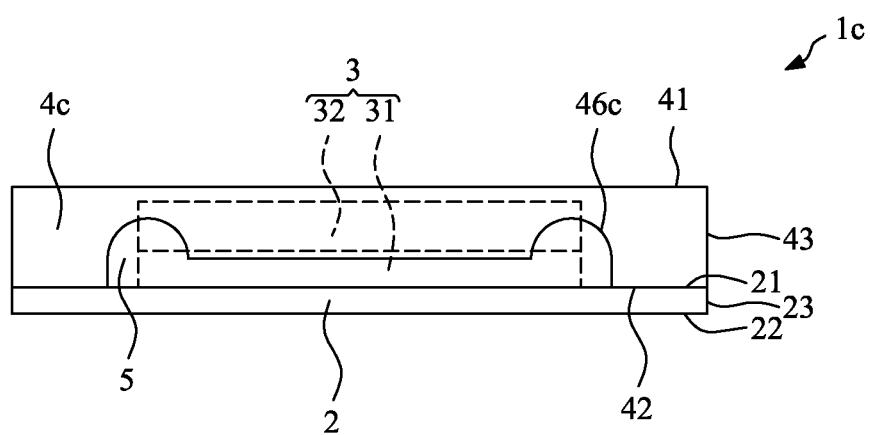
FIG. 8 illustrates a side view of an example of an optical package structure according to some embodiments of the present disclosure.

FIG. 8 illustrates a side view of an optical package structure 1c according to some embodiments of the present disclosure. The optical package structure 1c is similar to the optical package structure 1b shown in FIGS. 4 to 7, except for the shape of the tunnel 46c defined by the spacer 4c. As can be seen in FIG. 8, the tunnel 46c has a smaller height at a center, while the height at two sides is greater. Such shape provides the spacer 4c with an improved structural strength, with still enough space for the encapsulant 5 to flow therethrough during a manufacturing process thereof. In comparison, the tunnel 46 of FIG. 7 has a substantially consistent height, whereas the tunnel 46c of FIG. 8 does not have a consistent height.

Figure 9:
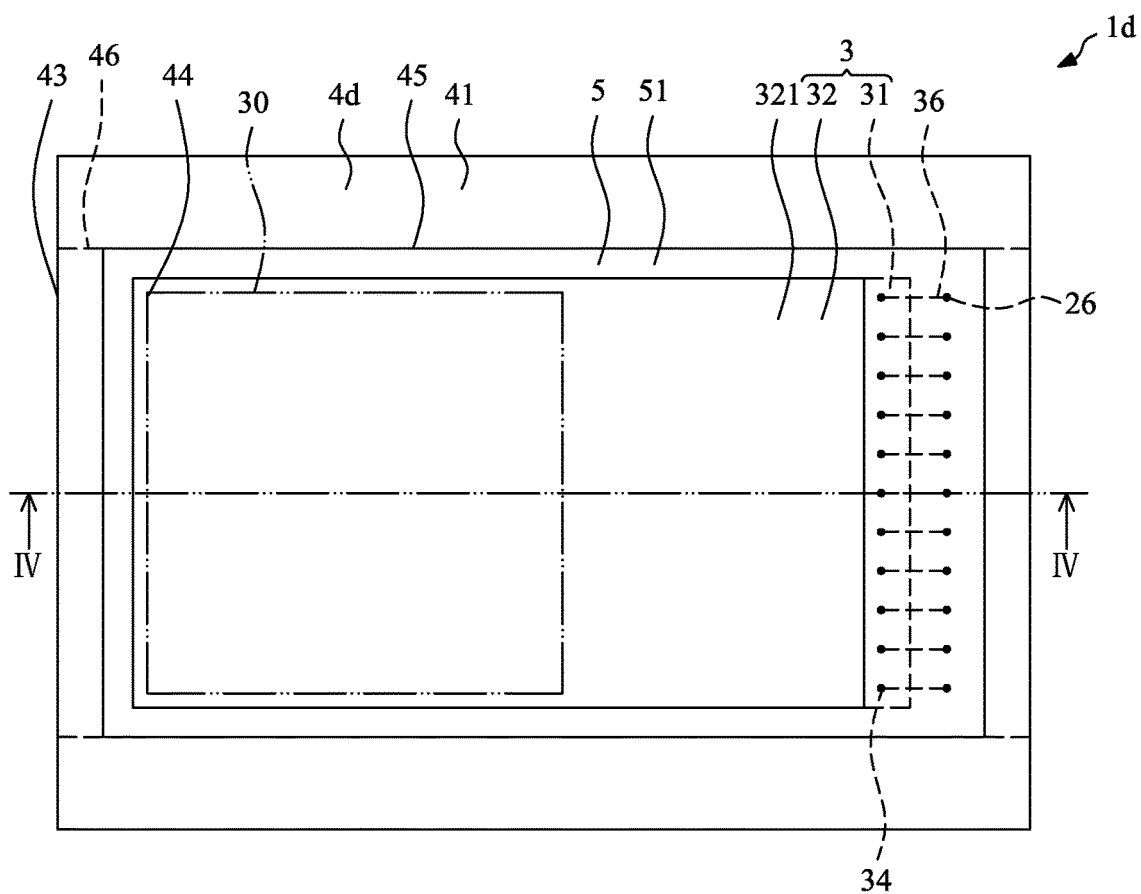
FIG. 9 illustrates a top view of an example of an optical package structure according to some embodiments of the present disclosure.
Figure 10:
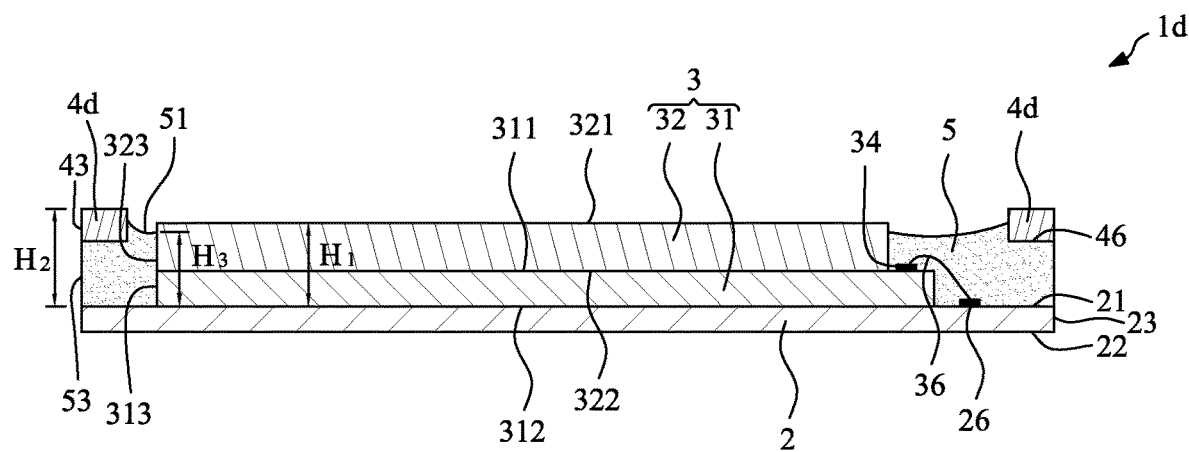
FIG. 10 illustrates a cross-sectional view taken along line IV-IV of the optical package structure shown in FIG. 9.

FIG. 9 illustrates a top view of an optical package structure 1d according to some embodiments of the present disclosure. FIG. 10 illustrates a cross-sectional view taken along line IV-IV of the optical package structure 1d shown in FIG. 9. The optical package structure 1d is similar to the optical package structure 1b shown in FIGS. 4 to 7, except for the spacer 4d. As can be seen in FIGS. 9 and 10, the opening 40 is omitted, and the spacer 4d completely surrounds the optical element 3. Besides, the tunnel 46 is defined at both sides.

FIG. 11 through FIG. 14 illustrate a method for manufacturing an optical package structure according to some embodiments of the present disclosure. In some embodiments, the method is for manufacturing an optical package structure such as the optical package structure 1 shown in FIGS. 1 and 2.

Figure 11:
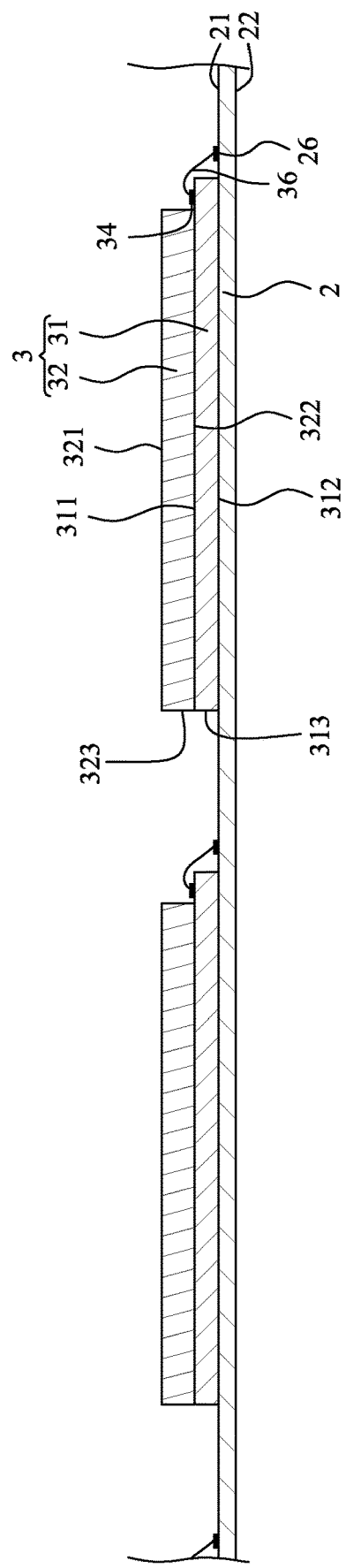
FIG. 11 illustrates one or more stages of an example of a method for manufacturing an optical package structure according to some embodiments of the present disclosure.

Referring to FIG. 11, a substrate 2 is provided. The substrate 2 has a first surface 21 and a second surface 22 opposite to the first surface 22. The first surface 21 may be a top surface. The substrate 2 may be a substrate of any type and material, which is not limited in the present disclosure. For example, the substrate 2 may include styrene-butadiene-styrene (SBS). In some embodiments, the substrate 2 may include a circuit layer having at least one conductive pad 26 disposed on the first surface 21.

A plurality of optical elements 3 is provided and disposed adjacent to a top surface (e.g., the first surface 21) of the substrate 2. In some embodiments, each of the optical element 3 includes an optical sensing chip 31 and a light-transmissive component 32 sequentially disposed on the substrate 2. The optical sensing chip 31 may be a contact image sensor (CIS) chip or a fingerprint recognition chip, and the light-transmissive component 32 may be a collimating element. The optical sensing chip 31 has a first surface 311, a second surface 312 opposite to the first surface 311, and a lateral surface 313 extending between the first surface 311 and the second surface 312. The second surface 312 of the optical sensing chip 31 may be attached to the first surface 21 of the substrate 2 by, for example, adhesion. The light-transmissive component 32 covers a portion of the optical sensing chip 31, while another portion of the second surface 312 of the optical sensing chip 31 is exposed. The optical sensing chip 31 may also include a circuit layer having a conductive pad 34 disposed on the first surface 311.

The light-transmissive component 32 has a first surface 321, a second surface 322 opposite to the first surface 321, and a lateral surface 323 extending between the first surface 321 and the second surface 322. The second surface 322 of the light-transmissive 32 component may be attached to the first surface 311 of the optical sensing chip 31 by, for example, adhesion. The optical element 3 has a first height $H_1$. For example, the first height $H_1$ may be defined between the second surface 312 of the optical sensing chip 31 and the first surface 321 of the light-transmissive component 32. The optical element 3 includes an active area (sensing area) 30 located at the optical sensing chip 31. The active area (sensing area) 30 is for receiving light from surroundings or receiving external pressing force. A size of the light-transmissive component 32 is less than a size of the optical sensing chip 31. Thus, the light-transmissive component 32 may not cover or contact the conductive pad 34 of the optical sensing chip 31. As shown in FIG. 11, the optical element 3 is a combination of two elements (e.g., the optical sensing chip 31 and the light-transmissive component 32). However, in other embodiments, the optical element 3 may be a single element, or the optical element 3 may include three or more elements.

At least one wire 36 is provided to connect the conductive pad 34 of the optical sensing chip 31 and the conductive pad 26 of the substrate 2. That is, the optical element 3 is electrically connected to the substrate 2 through the wire 36. Thus, the signals generated by the optical element 3 may be transmitted to the substrate 2 through the wire 36. A material of the wire 36 may include copper, gold or other suitable metal. As shown in FIG. 11, the wire 36 is disposed on one side of the optical sensing chip 31. However, in other embodiments, the wire 36 may be disposed on two or more sides of the optical sensing chip 31.

Figure 12:
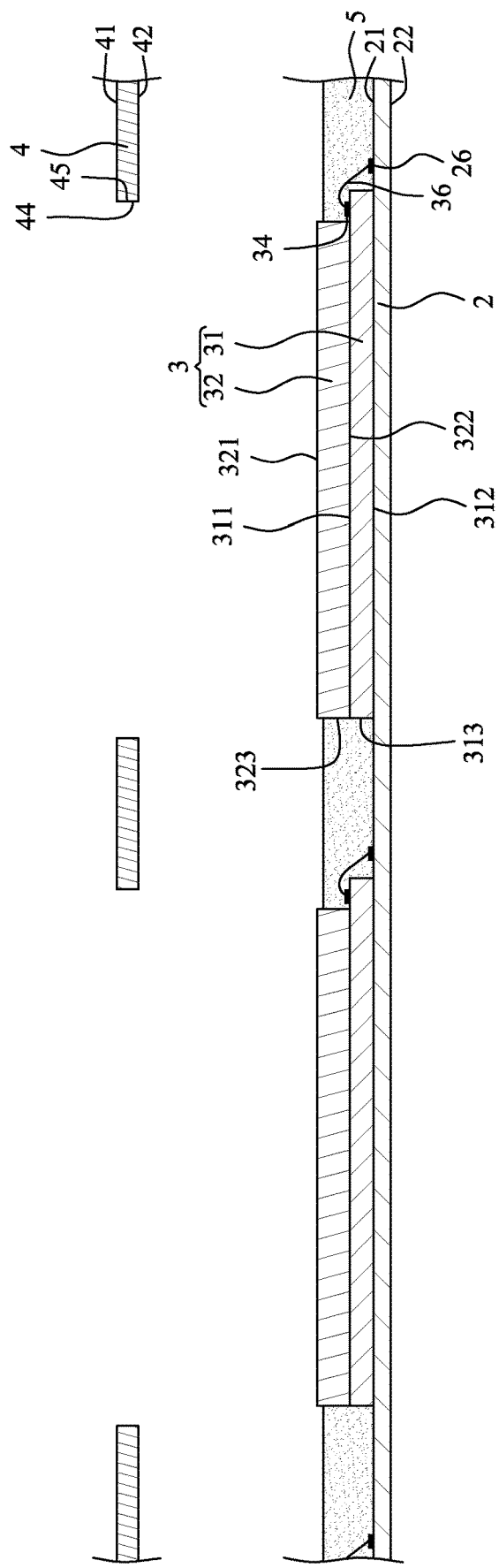
FIG. 12 illustrates one or more stages of an example of a method for manufacturing an optical package structure according to some embodiments of the present disclosure.

Referring to FIG. 12, an encapsulant 5 is dispensed on the first surface 21 of the substrate 2 and surrounds the optical element 3. Preferably, the dispensing process in the present disclosure excludes molding processes. For example, the encapsulant 5 may be a molding compound or an underfill, and may not yet be cured. The encapsulant 5 may cover the lateral surface 313 of the optical sensing chip 31 and at least a portion of the lateral surface 323 of the light-transmissive component 32. However, the encapsulant 5 does not cover the top surface of the optical element 3 (e.g., the first surface 321 of the light-transmissive component 32).

Then, a spacer 4 is provided. The spacer 4 has a first surface 41 and a second surface 42 opposite to the first surface 41. The first surface 21 may be a top surface. In some embodiments, the first surface 41 may be substantially flat. The spacer 4 has a plurality of inner surfaces 44 each defining a through hole 45 extends through the first surface 41 and the second surface 42 thereof.

Figure 13:
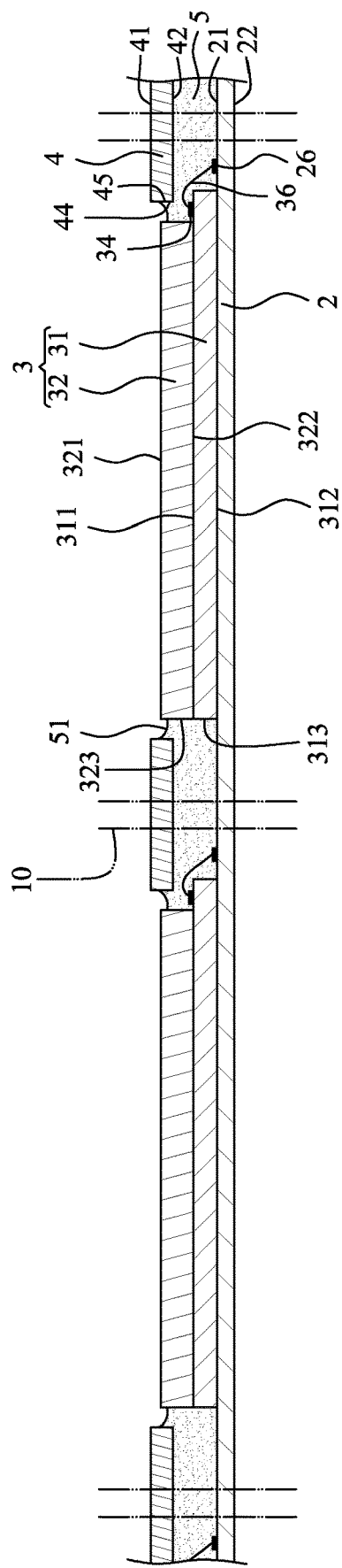
FIG. 13 illustrates one or more stages of an example of a method for manufacturing an optical package structure according to some embodiments of the present disclosure.

Referring to FIG. 13, the spacer 4 is disposed on the encapsulant 5, with the through holes 45 respectively corresponding to the optical elements 3. The second surface 42 of the spacer 4 faces the first surface 21 of the substrate 2 and contacts the encapsulant 5. Each the optical element 3, such as the light-transmissive component 32, is exposed in a respective through hole 45 of the spacer 4. The spacer 4 may cover a portion of the substrate 2, a portion of the optical sensing chip 31 and a portion of the wire 36. For example, the wire 36 may be disposed under the spacer 4. In some embodiments, the spacer 4 does not contact the substrate 2. For example, the spacer 4 is supported by the encapsulant 5 that is not yet cured.

The spacer 4 may press the encapsulant 5, such that a portion of the encapsulant 5 is disposed between the optical element 3 and the spacer 4, and is exposed in the through hole 45 of the spacer 4. The encapsulant 5 may adhere to the lateral surface 323 of the light-transmissible component 32 and the inner surface 44 of the spacer 4, thus forming a concave surface 51. Then, the encapsulant 5 is cured.

A distance between the top surface (e.g., the first surface 21) of the substrate 2 and the top surface (e.g., the first surface 41) of the spacer 4 is defined as a second height $H_2$. The encapsulant 5 has a third height $H_3$ at a position adjacent to the optical element 3, and $H_2 > H_1 \geq H_3$. For example, the third height $H_3$ may be distance from the first surface 21 of the substrate 2 to a topmost point of the encapsulant 5 contacting the lateral surface 323 of the light-transmissive component 32 (or an intersection point of the concave surface 51 of the encapsulant 5 and the lateral surface 323 of the light-transmissive component 32).

Figure 14:
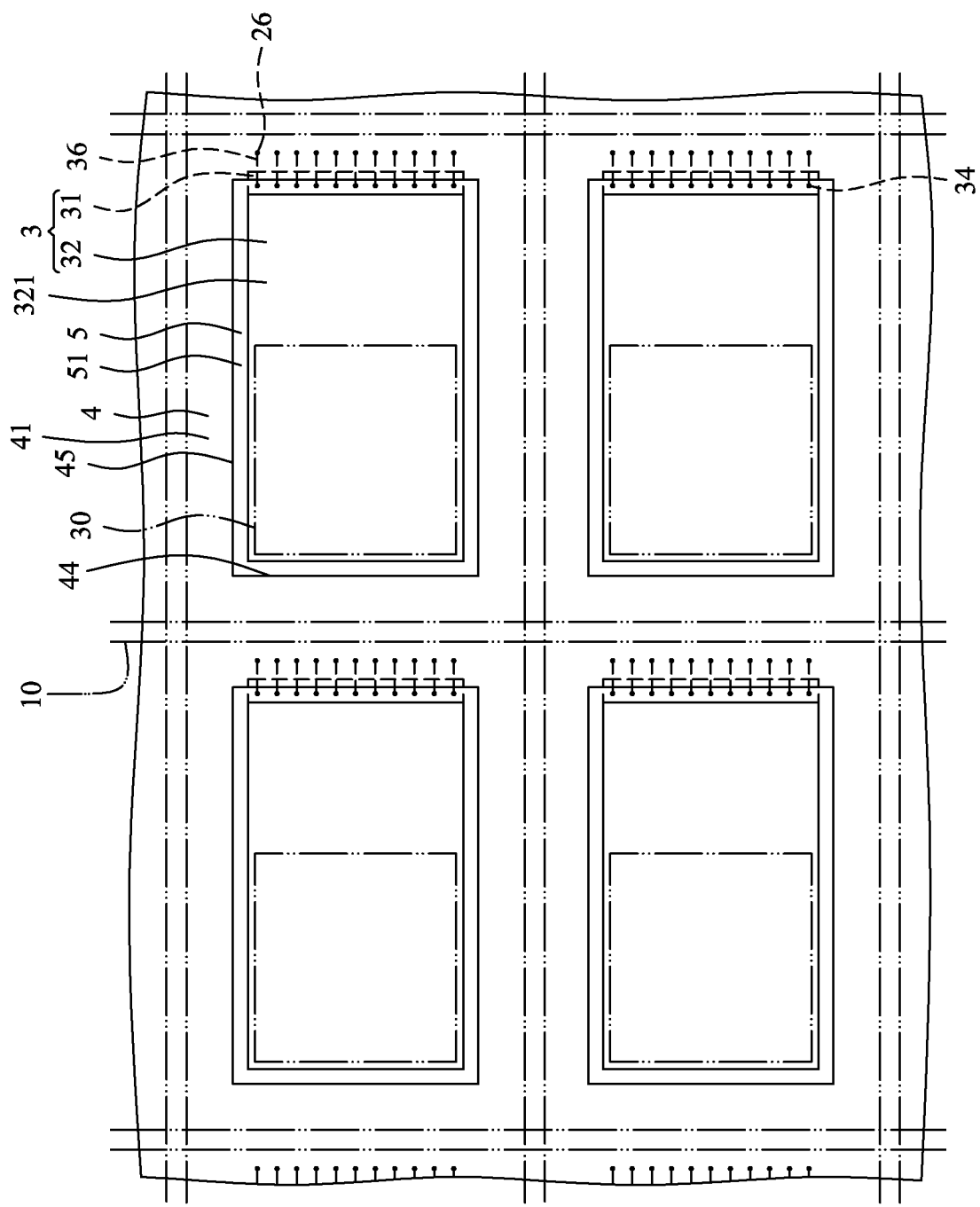
FIG. 14 illustrates one or more stages of an example of a method for manufacturing an optical package structure according to some embodiments of the present disclosure.

Referring to FIG. 14, a singulation process is conducted along a saw street 10, thus forming a plurality of optical package structures 1 as shown in FIGS. 1 and 2. The singulation process forms a lateral surface 23 of the substrate 2, an outer surface 43 of the spacer 4, and a lateral surface 53 of the encapsulant 5, as shown in FIG. 2. After the singulation process, the encapsulant 5 is exposed from the outer surface 43 of the spacer 4. The encapsulant 5 has a lateral surface 53, which is substantially coplanar with an outer surface 43 of the spacer 4 and/or a lateral surface 23 of the substrate 2. In addition, the spacer 4 is in a closed ring shape from a top view. For example, the spacer 4 is in a shape of a rectangular frame.

Figure 15:
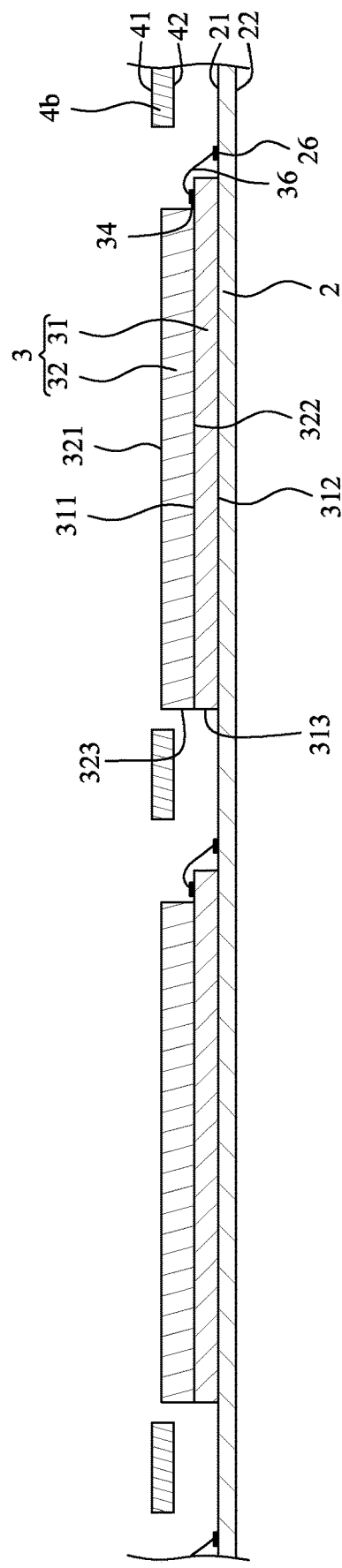
FIG. 15 illustrates one or more stages of an example of a method for manufacturing an optical package structure according to some embodiments of the present disclosure.

FIGS. 15 to 19 illustrate a method for manufacturing an optical package structure according to some embodiments of the present disclosure. In some embodiments, the method is for manufacturing an optical package structure such as the optical package structure 1b shown in FIGS. 4 to 7. The initial stages of the illustrated process are the same as, or similar to, the stages illustrated in FIG. 11. FIG. 15 depicts a stage subsequent to that depicted in FIG. 11.

Figure 16:
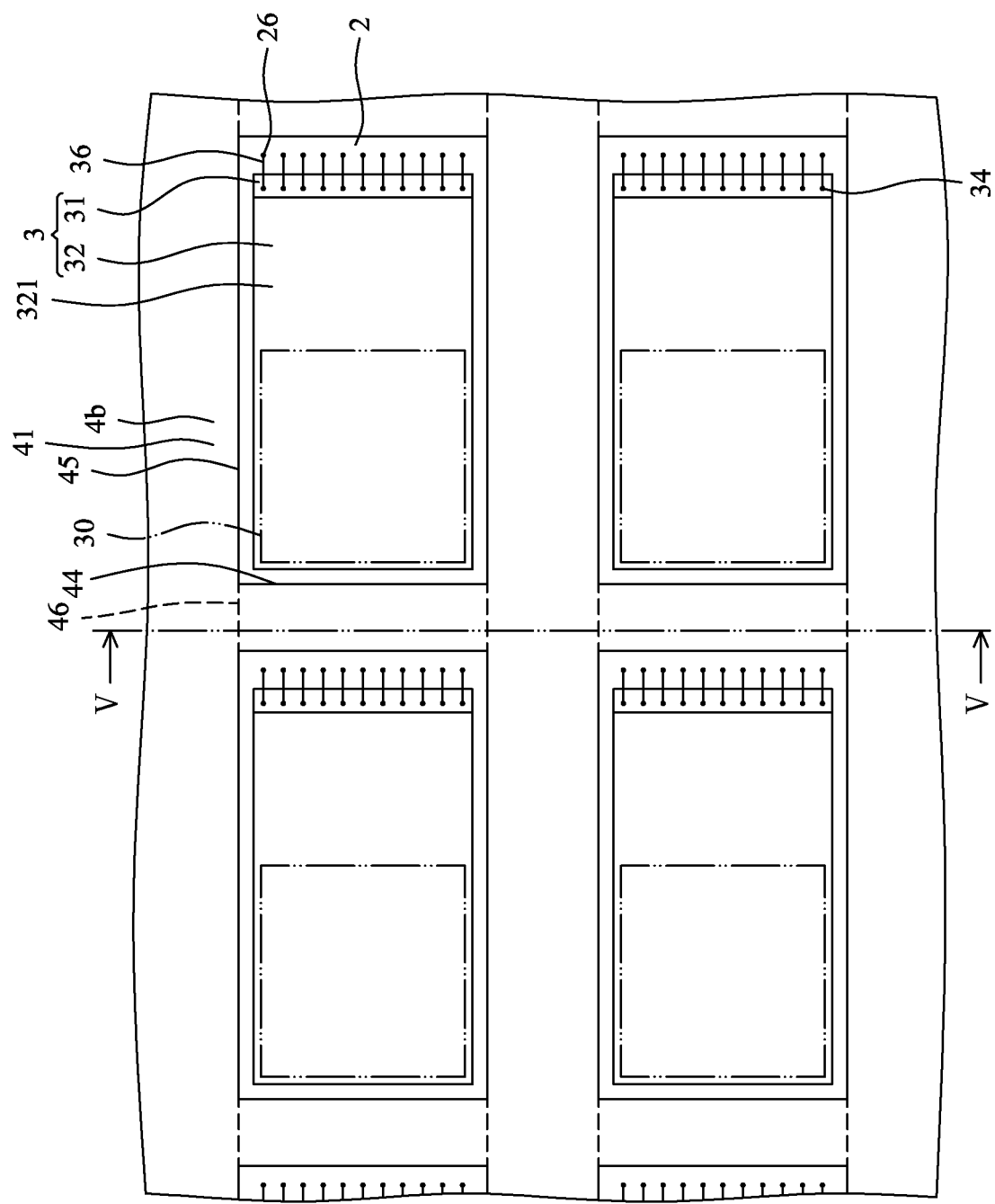
FIG. 16 illustrates one or more stages of an example of a method for manufacturing an optical package structure according to some embodiments of the present disclosure.
Figure 17:
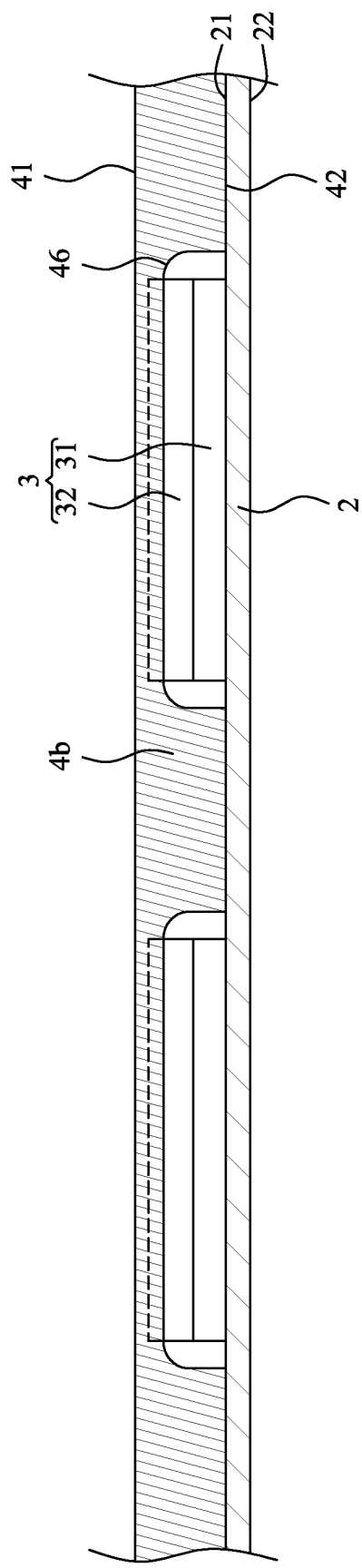
FIG. 17 illustrates one or more stages of an example of a method for manufacturing an optical package structure according to some embodiments of the present disclosure.

Referring to FIG. 15, a spacer 4b is provided and disposed on the substrate 2. FIG. 16 illustrates a top view of the structure shown in FIG. 15, and FIG. 17 illustrates a cross-sectional view taken along line V-V of the structure shown in FIG. 16. The spacer 4b has a first surface 41 and a second surface 42 opposite to the first surface 41. The first surface 21 may be a top surface. In some embodiments, the first surface 41 may be substantially flat. The spacer 4b has a plurality of inner surfaces 44 each defining a through hole 45 extends through the first surface 41 and the second surface 42 thereof. Referring to FIG. 17, the spacer 4b is disposed on attached to the substrate 2, with the through holes 45 respectively corresponding to the optical elements 3. The optical element 3 and the wire 36 are completely exposed in the through hole 45 of the spacer 4b. Referring to FIG. 17, the spacer 4b may be in a shape of a wall extends upwards from the first surface 21 of the substrate 2. The spacer 4b further defines a plurality of tunnels 46. Each tunnel 46 extends through adjacent two of the inner surfaces of the spacer 4b. That is, the tunnels 46 communicate the through holes 45 of the spacer 4b. A shape of the tunnel 46 is not limited in the present disclosure.

Figure 18:
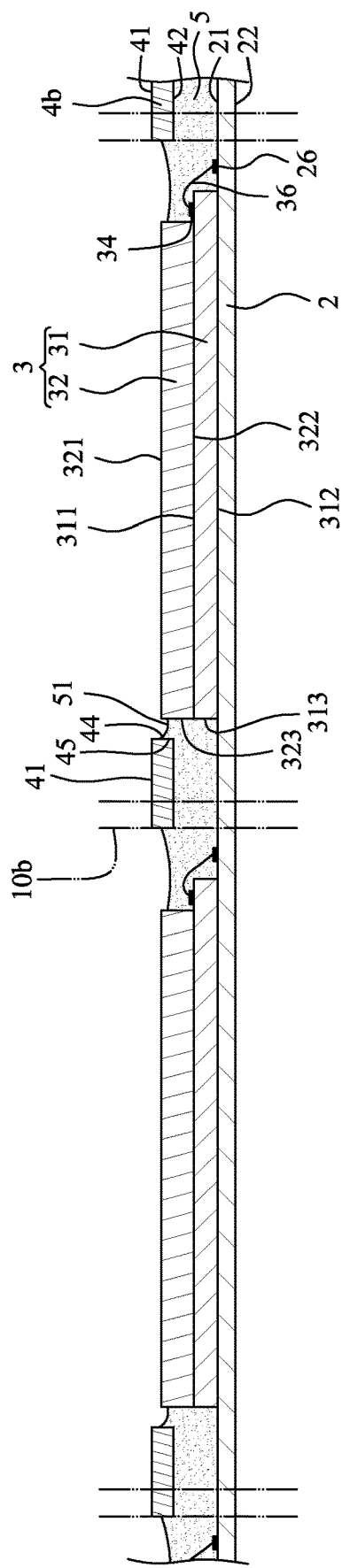
FIG. 18 illustrates one or more stages of an example of a method for manufacturing an optical package structure according to some embodiments of the present disclosure.

Referring to FIG. 18, an encapsulant 5 is dispensed between the spacer 4b and the optical element 3, such as on the substrate 2 and in the through holes 45 of the spacer 4b. The encapsulant 5 surrounds each of the optical elements 3. The encapsulant 5 may cover the lateral surface 313 of the optical sensing chip 31 and at least a portion of the lateral surface 323 of the light-transmissive component 32. However, the encapsulant 5 does not cover the top surface of the optical element 3 (e.g., the first surface 321 of the light-transmissive component 32) For example, the encapsulant 5 may be a molding compound or an underfill, and may not yet be cured. Hence, the encapsulant 5 may flow into and through the tunnels 46 into each of the through holes 45 of the spacer 4b. Accordingly, a height of the encapsulant 5 in each of the through holes 45 of the spacer 4b may substantially be the same. A portion of the encapsulant 5 is further disposed in and fills the tunnel 46 of the spacer 4b.

Figure 19:
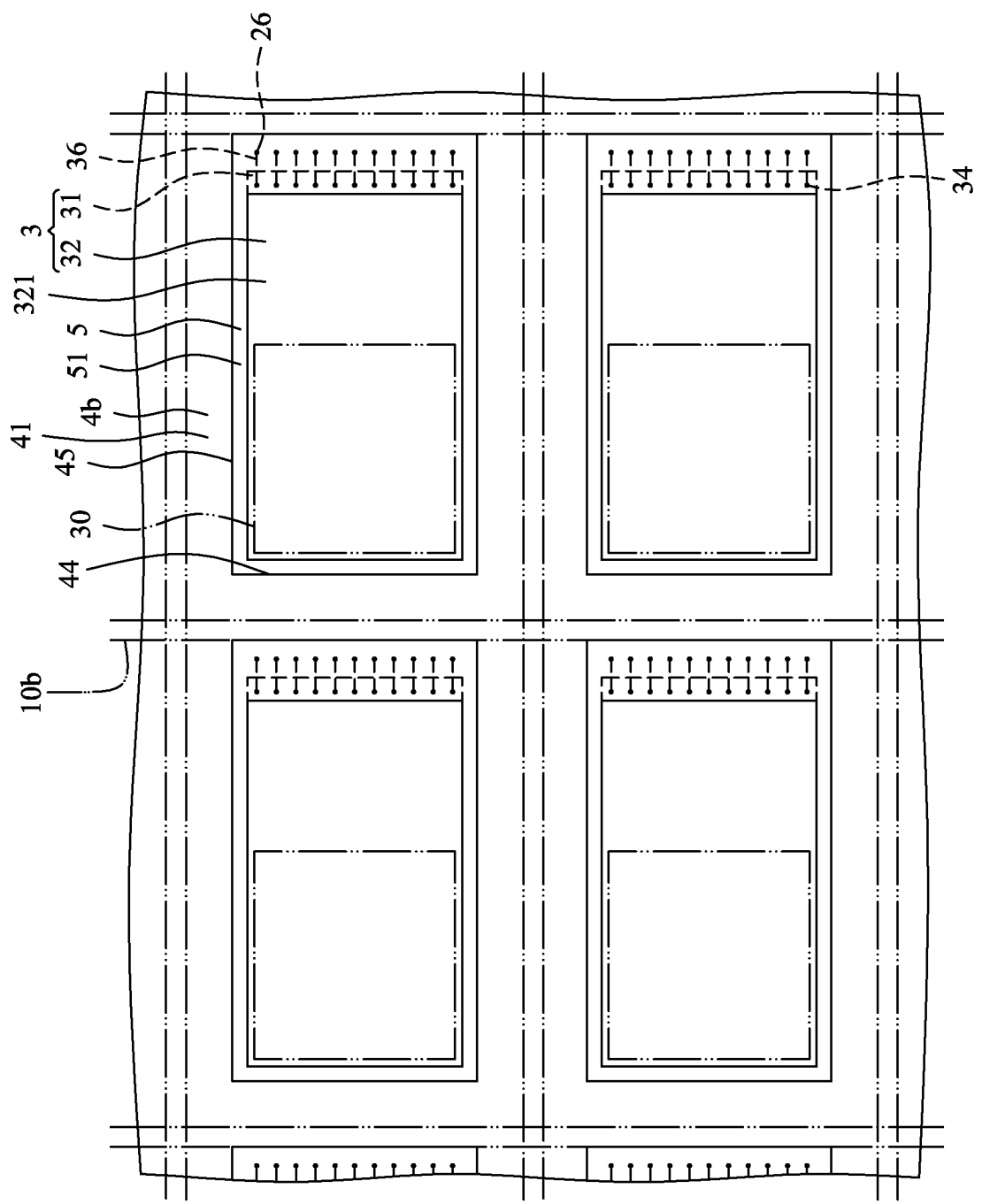
FIG. 19 illustrates one or more stages of an example of a method for manufacturing an optical package structure according to some embodiments of the present disclosure.

Then, after the encapsulant 5 is cured, a singulation process is conducted along a saw street 10b, thus forming a plurality of optical package structures 1b as shown in FIGS. 4 to 7. The singulation process forms a lateral surface 23 of the substrate 2, an outer surface 43 of the spacer 4b, and a lateral surface 53 of the encapsulant 5, as shown in FIGS. 5 to 7. After the singulation process, the portion of the encapsulant 5 disposed in the tunnel 46 of the spacer 4b is exposed from the outer surface 43 of the spacer 4b. The encapsulant 5 has a lateral surface 53, which is substantially coplanar with an outer surface 43 of the spacer 4b and/or a lateral surface 23 of the substrate 2. FIG. 19 illustrates a top view of the structure shown in FIG. 18. After the singulation process, the spacer 4b defines an opening 40 (FIG. 4). That is, the spacer 4b is not in a closed shape from a top view. For example, as shown in FIG. 4, the spacer 4b is in a rectangular shape from the top view, while one side of the rectangle is missing. The opening 40 is thus defined at the missing side, and may be located opposite to the tunnel 46. The encapsulant 5 is exposed from the missing side and in the opening of the spacer 4b.

Figure 20:
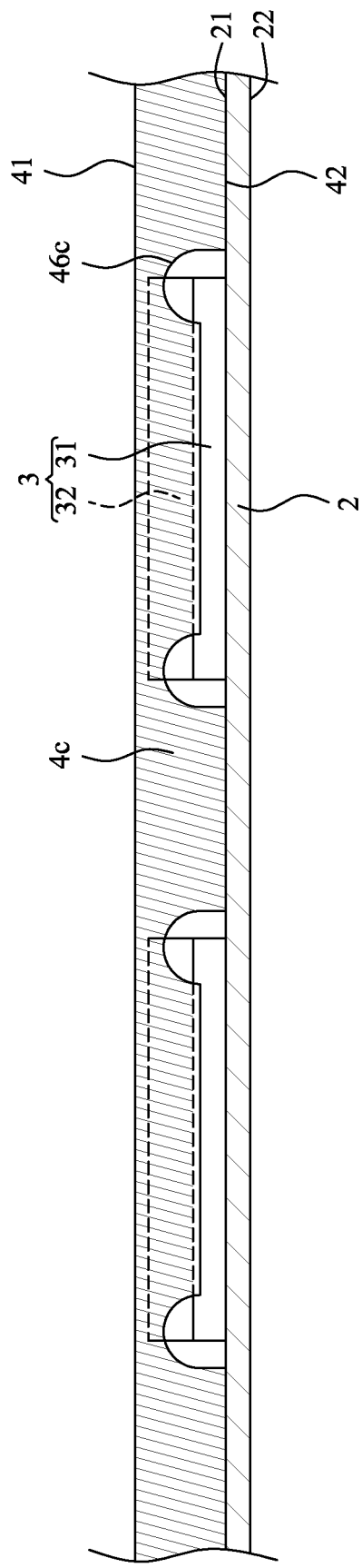
FIG. 20 illustrates one or more stages of an example of a method for manufacturing an optical package structure according to some embodiments of the present disclosure.

FIG. 20 illustrates a method for manufacturing an optical package structure according to some embodiments of the present disclosure. In some embodiments, the method is for manufacturing an optical package structure such as the optical package structure 1c shown in FIG. 8. The initial stages of the illustrated process are the same as, or similar to, the stages illustrated in FIGS. 15 and 16, except for the shape of the tunnels 46c of the spacer 4c as shown in FIG. 20.

Referring to FIG. 20, the tunnel 46c has a smaller height at a center, while the height at two sides is greater. Such shape provides the spacer 4c with an improved structural strength, with still enough space for the encapsulant 5 to flow therethrough during a manufacturing process thereof. The stages subsequent to that shown in FIG. 20 of the illustrated process are similar to the stages illustrated in FIGS. 18 and 19, thus forming the optical package structure 1c shown in FIG. 8.

Figure 21:
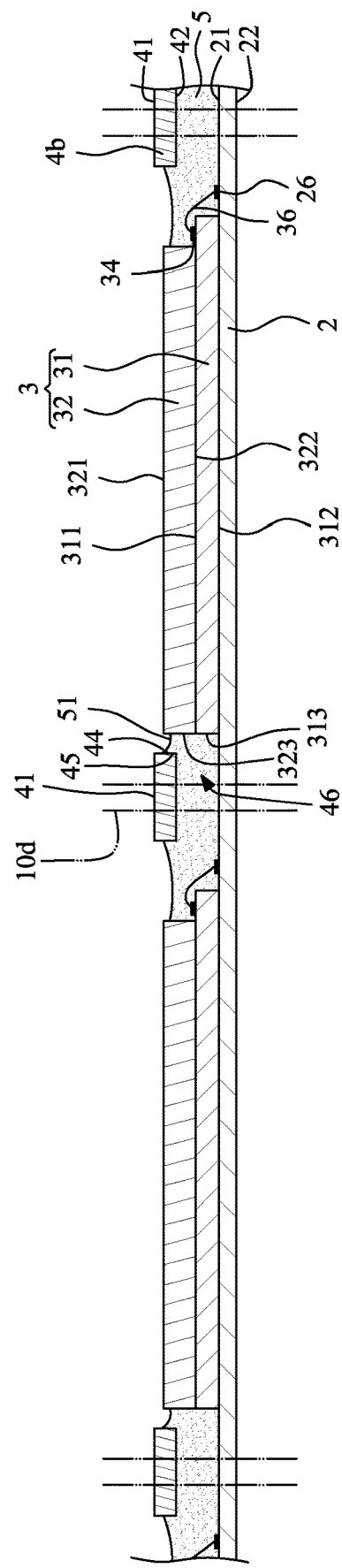
FIG. 21 illustrates one or more stages of an example of a method for manufacturing an optical package structure according to some embodiments of the present disclosure.
Figure 22:
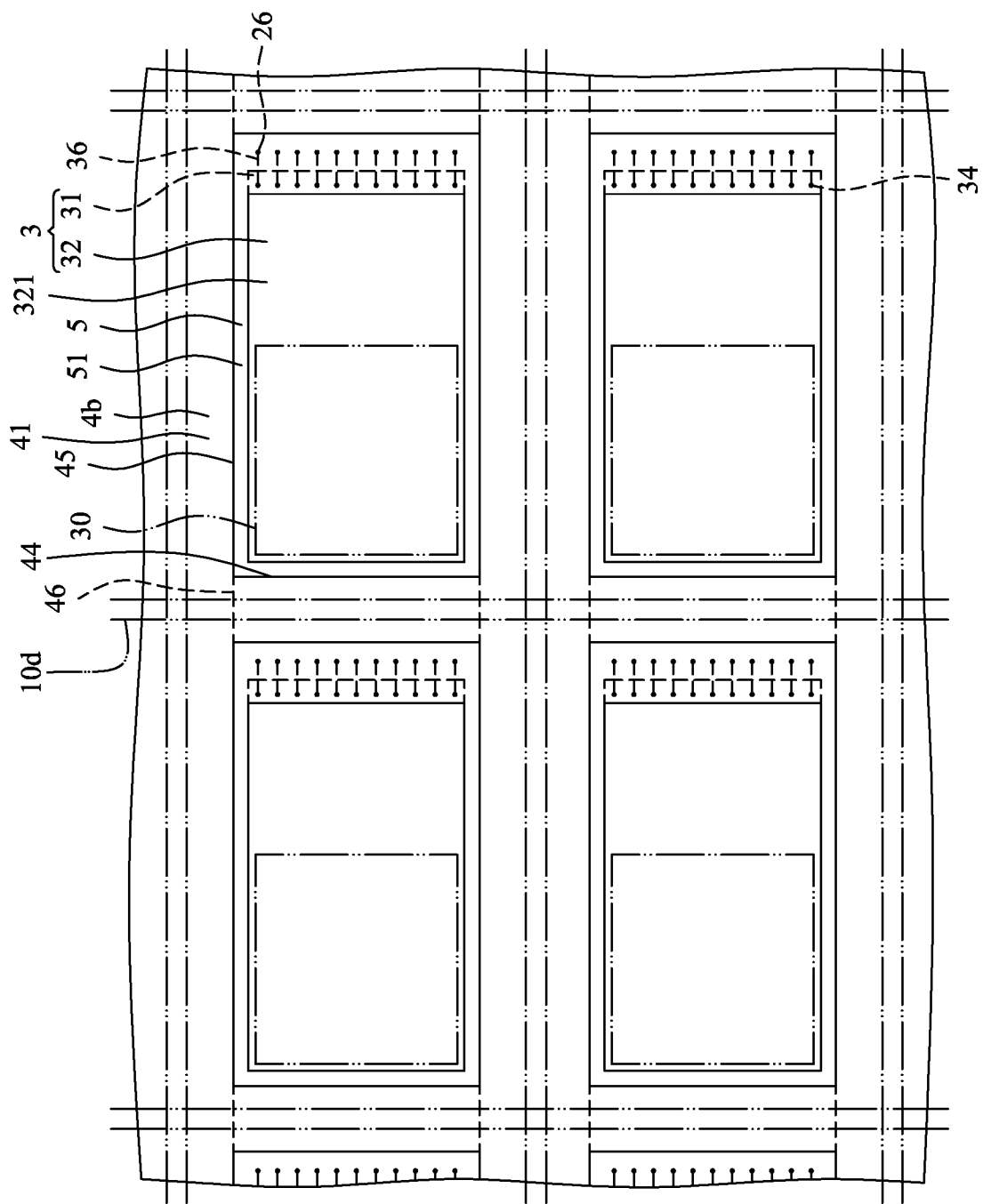
FIG. 22 illustrates one or more stages of an example of a method for manufacturing an optical package structure according to some embodiments of the present disclosure.

FIGS. 21 and 22 illustrate a method for manufacturing an optical package structure according to some embodiments of the present disclosure. In some embodiments, the method is for manufacturing an optical package structure such as the optical package structure 1d shown in FIGS. 9 and 10. The initial stages of the illustrated process are the same as, or similar to, the stages illustrated in FIGS. 15 to 19, except for the location of the saw street 10d as shown in FIGS. 21 and 22.

Referring to FIGS. 21 and 22, a singulation process may be conducted along a saw street 10d to form a plurality of optical package structure 1d as shown in FIGS. 9 and 10. The singulation process forms a lateral surface 23 of the substrate 2, an outer surface 43 of the spacer 4d, and a lateral surface 53 of the encapsulant 5, as shown in FIGS. 9 and 10. After the singulation process, the portion of the encapsulant 5 disposed in the tunnel 46 of the spacer 4d is exposed from the outer surface 43 of the spacer 4d. The encapsulant 5 has a lateral surface 53, which is substantially coplanar with an outer surface 43 of the spacer 4 and/or a lateral surface 23 of the substrate 2. However, the spacer 4d is in a closed ring shape from a top view. The spacer 4d completely surrounds the optical element 3. Besides, the tunnel 46 is defined at both sides.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical package structure, comprising:
   a substrate having a top surface;
   an optical element disposed adjacent to the top surface of the substrate and having a first height $H_1$;
   a spacer surrounding the optical element and having a top surface, wherein a distance between the top surface of the substrate and the top surface of the spacer is defined as a second height $H_2$; and
   an encapsulant disposed between the optical element and the spacer, and having a third height $H_3$ at a position adjacent to the optical element, wherein the encapsulant covers at least a portion of the optical element, the optical element is exposed from the encapsulant, and $H_2 > H_1 \geq H_3$.

2. The optical package structure of claim 1, wherein the optical element includes an optical sensing chip and a light-transmissive component.

3. The optical package structure of claim 1, wherein the encapsulant has a concave surface.

4. The optical package structure of claim 1, wherein the spacer is disposed on and attached to the substrate, and defines a tunnel.

5. The optical package structure of claim 4, wherein a portion of the encapsulant is disposed in the tunnel of the spacer.

6. The optical package structure of claim 4, wherein the spacer further defines an opening.

7. The optical package structure of claim 6, wherein the opening is opposite to the tunnel.

8. The optical package structure of claim 6, wherein the optical element is electrically connected to the substrate through a wire, and the wire is disposed in the opening of the spacer.

9. The optical package structure of claim 1, wherein the spacer has an outer surface, and the encapsulant is exposed from the outer surface of the spacer.

10. The optical package structure of claim 9, wherein the optical element is electrically connected to the substrate through a wire, and the wire is disposed under the spacer.

11. The optical package structure of claim 1, wherein the encapsulant contacts the spacer.

12. The optical package structure of claim 1, wherein a portion of the encapsulant is disposed under the spacer.

13. An optical package structure, comprising:
    a substrate having a top surface;
    an optical element disposed adjacent to the top surface of the substrate;
    a spacer surrounding the optical element and has an outer surface, wherein the spacer is disposed on and contacts the substrate, and the spacer defines a tunnel; and
    an encapsulant covering at least a portion of the optical element and disposed between the optical element and the spacer, wherein the encapsulant is exposed from the outer surface of the spacer, and a lateral surface of the encapsulant is substantially coplanar with the outer surface of the spacer.

14. The optical package structure of claim 13, wherein the optical element has a first height $H_1$, the spacer has a top surface, a distance between the top surface of the substrate and the top surface of the spacer is defined as a second height $H_2$, the encapsulant has a third height $H_3$ at a position adjacent to the optical element, and $H_2 > H_1 \geq H_3$.

15. The optical package structure of claim 13, wherein the optical element includes an optical sensing chip and a light-transmissive component.

16. The optical package structure of claim 13, wherein the encapsulant has a concave surface.

17. The optical package structure of claim 13, wherein a portion of the encapsulant is disposed in the tunnel of the spacer.

18. The optical package structure of claim 17, wherein the spacer further defines an opening.

19. The optical package structure of claim 18, wherein the opening is opposite to the tunnel.

* * * * *